United States Patent [19]

Alaspa

[11] 4,250,406
[45] Feb. 10, 1981

[54] SINGLE CLOCK CMOS LOGIC CIRCUIT WITH SELECTED THRESHOLD VOLTAGES

[75] Inventor: Allan A. Alaspa, Austin, Tex.

[73] Assignee: Motorola, Inc., Schaumburg, Ill.

[21] Appl. No.: 971,755

[22] Filed: Dec. 21, 1978

[51] Int. Cl.³ ............... H03K 19/08; G11C 19/28
[52] U.S. Cl. ........................ 307/205; 307/221 C; 307/279
[58] Field of Search ............ 307/205, 214, 221 C, 307/222, 223, 224, 279, 304

[56] References Cited

U.S. PATENT DOCUMENTS

| | | | |
|---|---|---|---|
| 3,900,747 | 8/1975 | Yamazaki et al. | 307/304 |
| 3,946,255 | 3/1976 | Stein | 307/221 C |
| 4,034,238 | 7/1977 | Tayakin et al. | 307/221 C |
| 4,035,662 | 7/1977 | Kuo | 307/205 |
| 4,057,741 | 11/1977 | Piquet | 307/279 |

Primary Examiner—Stanley D. Miller, Jr.
Assistant Examiner—B. P. Davis
Attorney, Agent, or Firm—Joe E. Barbee

[57] ABSTRACT

A CMOS logic circuit having a basic CMOS shift register useful as a shift register or in sequential logic circuits is provided. The circuit has two inverters plus an output inverter and two transistors which are enabled by a clock signal to couple the inverters together. The use of a single input clock signal along with the reduced number of transistors is achieved by proper selection of threshold voltages of the transistors.

14 Claims, 4 Drawing Figures

SINGLE CLOCK CMOS LOGIC CIRCUIT WITH SELECTED THRESHOLD VOLTAGES

This invention relates, in general, to CMOS logic circuits and more particularly, to a CMOS shift register cell useful in sequential logic circuits, such as D flip-flops, J-K flip-flops, etc.

Dynamic shift register cells are frequently used in electronic circuits because, among other things, they are convenient to use in the production of flip-flops. A dynamic circuit, such as a dynamic shift register for example, is one which continuously sequentially transfers data, ordinarily in binary voltage level form, from one cell of the circuit to another without actually storing the data in any cell. The function and use of many types of dynamic shift register circuits and flip-flop circuits are well known.

Threshold voltages of field effect transistors provide an effective barrier between binary data of "0" and "1" voltage levels in digital circuits. The effect of excessive threshold voltage, which must be overcome, is especially critical to high threshold device circuits and to internal portions of integrated circuits where the drive voltage and required noise margin are low. U.S. Pat. No. 4,035,662 which issued to Kuo describes capacitive means for eliminating the effect of the excessive threshold voltages in insulated gate field effect transistors. However, it should be noted that this patent proposes the addition of capacitors to the gate electrode of various field effect transistors in the circuit and therefore would appear to increase the size of the circuit.

It is well known that it is highly desirable to decrease the size of circuits on integrated circuit chips. One way to reduce the size of a dynamic D flip-flop is described in U.S. Pat. No. 4,057,741 to Piguet. This patent seems to achieve its objective by a particular arrangement of its transistors without trying to control the threshold voltages of the transistors.

Accordingly, it is an object of the present invention to provide a CMOS logic circuit having a minimum number of transistors by adjusting the threshold voltages of the transistors.

Another object of the present invention is to provide a CMOS logic circuit which will be functional at operating voltages corresponding to operating voltages employed in similar logic circuits having more transistors.

A further object of the present invention is to provide a CMOS logic circuit having a minimum number of transistors and yet will not exhibit leakage currents in series connected transistors.

Yet another object of the present invention is to provide a basic CMOS storage element circuit having reduced complexity due to the elimination of one clock line.

SUMMARY OF THE INVENTION

In carrying out the above and other objects of the present invention, in one form, there is provided a CMOS logic circuit having transistors whose threshold voltages have been adjusted so that reliable operation will result with a minimum number of field effect transistors. The CMOS logic circuit has an input for receiving an input signal and has a clock input for receiving a clock input signal. A first, a second, and an output inverter are used. A first transistor of a first conductivity type is used to couple the first and second inverters together. The first transistor has a control electrode which is coupled to the clock input. A second transistor of a second conductivity type couples the second and the output inverters together. The second transistor has a control electrode which is coupled to the clock input. The first and second transistors each have a threshold voltage within a first predetermined range. The second inverter has at least a transistor of a second conductivity type and the output inverter has at least a transistor of the first conductivity type. The transistor of the second inverter and the transistor of the output inverter each have a threshold voltage within a second predetermined range.

DETAILED DESCRIPTION

In many CMOS processes the inherent P-channel threshold voltage is approximately 1.26 volts while the inherent N-channel threshold voltage is approximately 0.6 volts. The threshold voltage of both the P and N can be varied by varying the implant doping. By the proper selection of masks, the threshold voltage of some of the transistors can be varied while yet the threshold voltage of other transistors can be left unchanged. The preferred technique employed in the present invention is to adjust the P-channel threshold voltage downward in preselected transistors and to adjust the N-channel threshold voltage upward of certain transistors.

Figure 1:
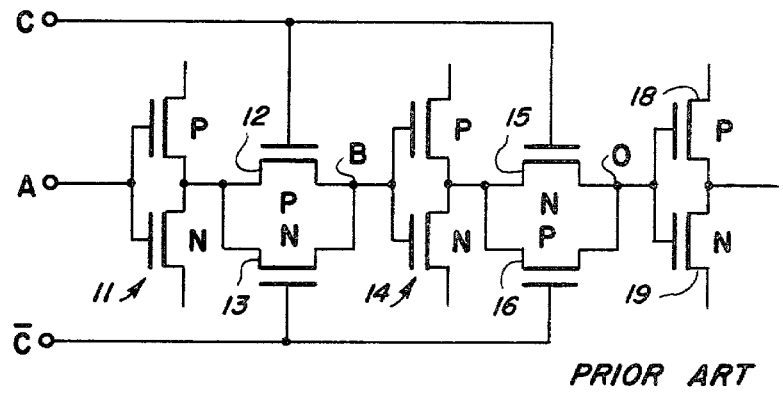
FIG. 1 illustrates a prior art circuit having a basic dynamic CMOS shift register cell.

The prior art circuit illustrated in FIG. 1 includes the basic dynamic CMOS shift register cell which is useful in flip-flops. The basic dynamic CMOS shift register cell includes an inverter 11 which receives input signal A, a first transmission gate having transistors 12 and 13, inverter 14, and a second transmission gate having transistors 15 and 16 and providing output O. The output O is coupled to an output inverter having a P-channel transistor 18 and an N-channel transistor 19. The circuit receives two clock inputs C and $\overline{C}$.

In operation, input A is inverted by inverter 11 and is coupled to node B by P-channel transistor 12 and N-channel transistor 13 when clock signal C is in a low state and clock signal $\overline{C}$ is in a high state. It should be noted that clock signal $\overline{C}$ is a complement of clock signal C. The signal at node B is inverted by inverter 14 and is coupled to node O by N-channel transistor 15 and P-channel transistor 16 when clock signal C is high and clock signal $\overline{C}$ is low. The signal at node O is inverted by the output inverter having P-channel transistor 18 and N-channel transistor 19. It will be understood by those skilled in the art that the inverters are connected between two power supply terminals, wherein the P-channel transistor is supplied with a voltage typically called $V_{DD}$ and the N-channel typically connected to a power supply terminal called $V_{SS}$.

Figure 2:
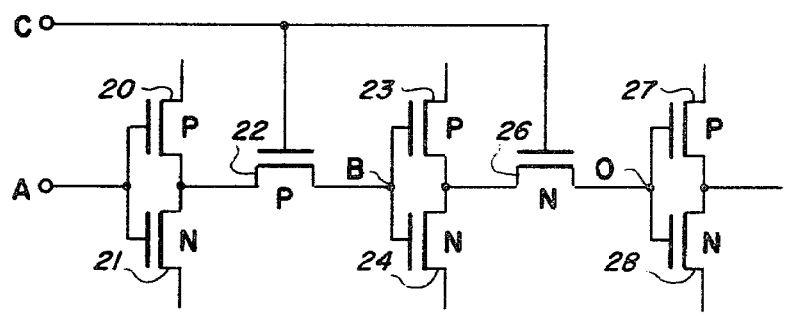
FIG. 2 illustrates an embodiment of the present invention and is readily noted to be a simplification of the circuit of FIG. 1.

The circuit of FIG. 2 includes a basic dynamic CMOS shift register cell and performs the same function as the circuit of FIG. 1, yet has less transistors and requires only one clock input signal C. Without the benefit of Applicant's invention this circuit would not be considered practical for any normal moderate to high speed application or low power application especially when clock input signal C equals voltage $V_{DD}$, because in such a case N-channel transistor 26 would be in a source follower mode as the voltage at node O was being driven towards $V_{DD}$ by clock input signal C. The voltage at node O will approach to within the voltage threshold value of transistor 26 to $V_{DD}$. The complement of this condition occurs at P-channel transistor 22 when it tries to pull node B to $V_{SS}$ when clock signal C is low. Whenever the N-channel threshold voltage does not equal the P-channel threshold voltage the final resting voltages at nodes B and O will be such that the following inverter will not go to the zero current mode thereby having a leakage current which defeats the purpose of using CMOS circuitry to reduce power consumption.

This invention uses two different P and N-channel threshold voltages thereby allowing the circuit to operate with the usual nano amp current drain. The different threshold voltages are achieved by implant doping during the semiconductor process. One technique for controlling threshold voltages by implant doping is set out in an article entitled "Ion Implantation For Threshold Control in COS MOS Circuits", IEEE Transactions on Electron Devices, Volume ED-21, No. 6, June 1974. In a preferred embodiment of the present invention the thresholds of P-channel transistor 22 and N-channel transistor 26 are adjusted to be in a range between 0.4 volts and 0.8 volts, and the threshold voltage of N-channel transistor 24 and P-channel transistor 27 are adjusted to be in a range between 1.1 volts and 1.5 volts. The threshold voltages of the other transistors are not as critical and therefore can be at some convenient value. In the preferred embodiment, the top of the low range (0.4–0.8) should be lower than the bottom of the high range (1.1–1.5) to avoid high current leakages.

In FIG. 2, input signal A is connected to an inverter having a P-channel transistor 20 and an N-channel transistor 21 connected in series. Input A is connected to the control electrodes of transistors 20 and 21 and when in the high state activates transistor 21 and in the low state activates transistor 20. The output from this first inverter formed by transistors 20 and 21 is coupled by P-channel transistor 22 to node B. P-channel transistor 22 has its gate electrode connected to clock input signal C. A second inverter having P-channel transistor 23 and N-channel transistor 24 inverts the signal at node B and provides an output which is coupled to node O by N-channel transistor 26. N-channel transistor 26 has its gate electrode connected to clock input signal C. The basic dynamic CMOS shift register cell is provided by the components between input A and node O. The signal at node O is inverted by an output inverter having a P-channel transistor 27 and an N-channel transistor 28.

Those persons skilled in the art will recognize that the P-channel transistors can be replaced by N-channel transistors and the N-channel transistors can be replaced by P-channel transistors with the proper selection of $V_{DD}$ and $V_{SS}$ and apply the teachings of the present invention to maintain the advantages thereof. Also the inverters are illustrated as two series connected CMOS transistors having their gate electrodes connected together, but it will be understood that any inverting circuit could be used, such as logic gates, e.g. a NOR gate.

Figure 3:
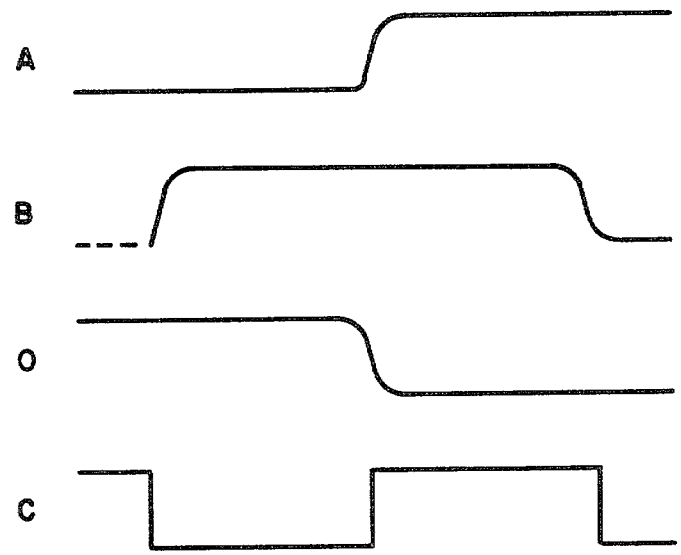
FIG. 3 is a timing waveform chart which is applicable to both FIGS. 1 and 2.

Four waveforms A, B, O, and C are illustrated in FIG. 3 and show that the operation of the circuit in FIGS. 1 and 2 operate in a similar manner although the circuit in FIG. 2 has less transistors and uses only one clock input signal. Input A is inverted by the first inverter and is not coupled to node B until clock signal C goes to a low level. When clock signal C goes to a low level, transistors 12, 13 (FIG. 1) and 22 (FIG. 2) are enabled. The output of the second inverter is not coupled to node O until clock signal C once again goes high thereby enabling transistors 15, 16 (FIG. 1) and 26 (FIG. 2).

Figure 4:
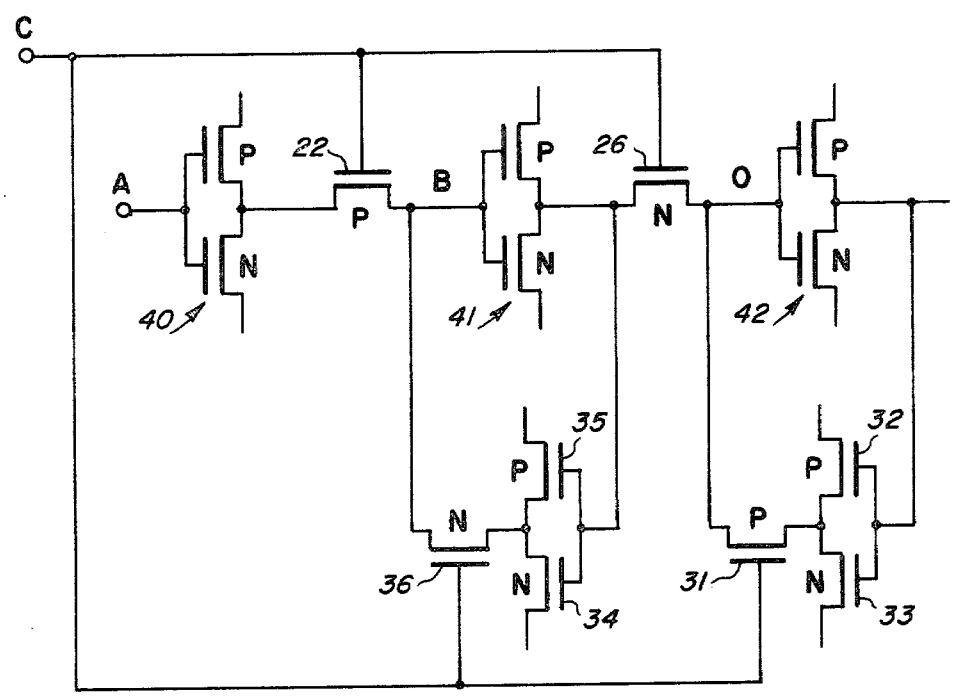
FIG. 4 illustrates how the circuit of FIG. 2 can be modified to obtain a static CMOS shift register cell.

FIG. 4 illustrates an embodiment of the invention used in a basic static storage element. It will be understood that the basic storage element is useful in shift registers or sequential logic circuits such as D flip-flops, J-K flip-flops, toggle flip-flops, etc. The operation and connection of inverters 40, 41, 42 and coupling transistors 22, 26 is the same as in FIG. 2, and therefore, will not be discussed again. Both transistors in inverter 41 and both transistors in inverter 42 will have a threshold voltage in the range of 1.1 to 1.5 volts. Transistors 22, 26, 31, and 36 will have a threshold voltage in the range of 0.4 to 0.8 volts. The threshold voltages of the other transistors in FIG. 4 is of secondary importance. The static shift register embodiment of the circuit illustrated in FIG. 4, unlike the dynamic circuits illustrated in FIGS. 1 and 2, can retain a piece of binary data in a single cell for a long period of time. The output of inverter 42 is coupled to an input of a feedback inverter having transistor 32 and 33. The output of this feedback inverter is connected to node O by P-channel transistor 31. The gate or control electrode of transistor 31 is connected to clock signal C. Another feedback inverter having transistors 34 and 35 couples the output of inverter 41 to an N-channel transistor 36. Transistor 36 couples the output of the another feedback inverter to the input of inverter 41 or node B. The control electrode of transistor 36 is connected to clock signal C. By controllably feeding the output of two of the inverters of FIG. 2 back into the inputs of the two inverters, the dynamic circuit of FIG. 2 is made into a static circuit as shown in FIG. 4.

By now it should be appreciated that there has been provided a basic CMOS logic circuit useful in shift registers and other sequential logic circuits, such as flip-flops, which uses less transistors than similar prior art circuits. In addition, the present invention eliminates the need for a second clock input signal thereby reducing the number of metallization lines required on an integrated circuit employing the present invention. This of course is a great saving in the manufacturing of the circuit.

Embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention, will, without departing from the spirit and scope of the invention, be apparent to persons skilled in the art.

I claim:

1. A CMOS logic circuit having an input for receiving an input signal and also having a single clock input for receiving a clock signal, comprising: a first inverter coupled to the input for inverting the input, the first inverter having an output; a first coupling transistor of a first conductivity type have a first, a second, and a control electrode, the first electrode being coupled to the output of the first inverter, and the control electrode being coupled to the clock input; a second inverter having an input and an output, the input of the second inverter being coupled to the second electrode of the first coupling transistor; a second coupling transistor having a first, a second, and a control electrode, the first electrode of the second coupling transistor being coupled to the output of the second inverter, the second coupling transistor being of a second conductivity type and having its control electrode coupled to the clock input; and an output inverter for inverting the output of the second inverter, the output inverter having an input and an output, the input of the output inverter being coupled to the second electrode of the second coupling transistor, the first and second coupling transistors having a threshold voltage in a first range and the second and output inverters each having at least one transistor having a threshold voltage in a second predetermined range.

2. The CMOS logic circuit of claim 1 wherein the first range of threshold voltage is substantially between 0.4 volts and 0.8 volts.

3. The CMOS logic circuit of claim 1 wherein the second predetermined range of threshold voltage is substantially between 1.1 volts and 1.5 volts.

4. The CMOS logic circuit of claim 3 wherein the transistor of the second inverter which has the threshold voltage of a second predetermined value is of the second conductivity type and the transistor of the output inverter which has the threshold voltage of a second predetermined value is of the first conductivity type.

5. The CMOS logic circuit of claim 1 wherein the transistor of the first conductivity type is a P-channel field effect transistor and the transistor of the second conductivity type is an N-channel field effect transistor.

6. The CMOS logic circuit of claim 1 further including a third coupling transistor having a first, a second, and a control electrode, the first electrode of the third coupling transistor being coupled to the second electrode of the first coupling transistor, the control electrode of the third coupling transistor being coupled to the clock input, and a first feedback inverter having an input and an output, the input of the first feedback inverter being coupled to the first electrode of the second coupling transistor and the output of the first feedback inverter being coupled to the second electrode of the first coupling transistor, and a second feedback inverter having an input and an output, the input of the second feedback inverter being coupled to the output of the output inverter, and a fourth coupling transistor having a control electrode and coupling the output of the second feedback inverter to the input of the output inverter, the control electrode of the fourth coupling transistor being coupled to the clock input.

7. The CMOS logic circuit of claim 6 wherein the third and fourth coupling transistors have a threshold voltage substantially in the range of 0.4 volts to 0.8 volts.

8. A CMOS circuit having an input for an input signal and having a clock input, comprising: a first, a second, and an output inverter, each inverter having an input and an output; a first transistor of a first conductivity type coupling the first and second inverters together and having a control electrode coupled to the clock input; and a second transistor of a second conductivity type coupling the second and output inverters together and having a control electrode coupled to the clock input, the first and second transistors each having a threshold voltage in a first predetermined range, and the second inverter having at least one transistor of the second conductivity type and the output inverter having at least one transistor of the first conductivity type wherein the at least one transistor of the second inverter and the at least one transistor of the output inverter each have a threshold voltage in a second predetermined range.

9. The CMOS circuit of claim 8 wherein the first predetermined range is substantially 0.4 to 0.8 volts, and the second predetermined range is substantially 1.1 to 1.5 volts.

10. The CMOS circuit of claim 8 further including a first and a second feedback inverter each having an input and an output, a third transistor of a second conductivity type coupling the output of the first feedback inverter to the input of the second inverter, the input of the first feedback inverter being coupled to the output of the second inverter, a fourth transistor of a first conductivity type coupling the output of the second feedback inverter to the input of the output inverter, the input of the second feedback inverter being coupled to the output of the output inverter, and the third and fourth transistors each having control electrodes coupled to the clock input.

11. The CMOS circuit of claim 10 wherein the third and fourth transistors have a threshold voltage in the first predetermined range, and the second and output inverters have transistors having threshold voltages in the second predetermined range.

12. A CMOS circuit useful in sequential logic circuits and having a circuit input for an input signal and a clock input for a clock signal, comprising: first means for inverting the input signal, the first means having an input coupled to the circuit input and having an output; second means for inverting and having an input and an output; a first controllable coupler for coupling the output of the first means to the input of the second means, the first controllable coupler being controllable by the clock signal; third means for inverting having an input and an output; and a second controllable coupler for coupling the output of the second means to the input of the third means, the first and second controllable couplers having a threshold voltage within a first predetermined range, and the second and third means each having at least one field effect transistor having a threshold voltage within a second predetermined range.

13. The CMOS circuit of claim 12 further having fourth means for inverting having an input and an output, the input of the fourth means being coupled to the output of the second means; a third controllable coupler for coupling the output from the fourth means to the input of the second means; fifth means for inverting having an input and an output, the input of the fifth means being coupled to the output of the third means; and a fourth controllable coupler for coupling the output of the fifth means to the input of the third means, the third and fourth controllable couplers being controllable by the clock signal and having a threshold voltage within the first predetermined range.

14. The CMOS circuit of claim 13 wherein the first predetermined range is substantially 0.4 to 0.8 volts, and the second predetermined range is substantially 1.1 to 1.5 volts.

* * * * *